United States Patent
Ho et al.

(10) Patent No.: US 11,164,937 B2
(45) Date of Patent: Nov. 2, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yi-Chen Ho, Taichung (TW); Chien Lin, Hsinchu (TW); You-Hua Chou, Hsinchu (TW); Hsing-Yuan Huang, Taoyuan (TW); Cheng-Yu Hung, Changhua County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/255,567

(22) Filed: Jan. 23, 2019

(65) Prior Publication Data

US 2020/0235199 A1 Jul. 23, 2020

(51) Int. Cl.
  *H01L 49/02* (2006.01)
  *H01L 21/02* (2006.01)
  *H01L 21/321* (2006.01)
  *H01L 21/311* (2006.01)

(52) U.S. Cl.
  CPC ............ *H01L 28/84* (2013.01); *H01L 21/022* (2013.01); *H01L 21/0228* (2013.01); *H01L 21/31116* (2013.01); *H01L 21/3212* (2013.01)

(58) Field of Classification Search
  None
  See application file for complete search history.

(56) References Cited

U.S. PATENT DOCUMENTS

| | | | | |
|---|---|---|---|---|
| 5,817,555 A * | 10/1998 | Cho | ................ | H01L 27/10817 438/253 |
| 6,093,617 A * | 7/2000 | Su | ......................... | H01L 28/84 257/E21.013 |
| 6,127,221 A * | 10/2000 | Lin | ........................ | H01L 28/84 257/E21.013 |
| 6,133,090 A * | 10/2000 | Hong | ..................... | H01L 28/82 257/E21.012 |
| 6,133,110 A * | 10/2000 | Peng | ..................... | H01L 28/82 257/E21.012 |
| 6,268,245 B1 * | 7/2001 | Wu | ................... | H01L 27/10817 257/E21.012 |
| 6,492,245 B1 * | 12/2002 | Liu | ...................... | H01L 21/764 438/422 |

(Continued)

OTHER PUBLICATIONS

Jaeyun Kim, et al., "Magnetic Fluorescent Delivery Vehicle Using Uniform Mesoporous Silica Spheres Embedded with Monodisperse Magnetic and Semiconductor Nanocrystals", American Chemical Society 2006, 128, (Dec. 31, 2005) 688-689.

(Continued)

*Primary Examiner* — Khaja Ahmad
(74) *Attorney, Agent, or Firm* — Maschoff Brennan

(57) ABSTRACT

A semiconductor device includes a semiconductor substrate, a capacitor, and an interconnection layer. The capacitor is over the semiconductor substrate and includes a bottom electrode, a top electrode, and an insulator layer. The top electrode has a top surface and a bottom surface rougher than the top surface of the top electrode. The insulator layer is between the bottom electrode and the top electrode. The interconnection layer is over the semiconductor substrate and is electrically connected to the capacitor.

20 Claims, 10 Drawing Sheets

(56) References Cited

U.S. PATENT DOCUMENTS

| | | | | |
|---|---|---|---|---|
| 2008/0121957 A1* | 5/2008 | Kanaya | ............... | H01L 28/57 257/295 |
| 2010/0072474 A1* | 3/2010 | Abe | ............. | H01L 27/11206 257/57 |
| 2015/0255372 A1* | 9/2015 | Kamgaing | ........ | H01L 25/0657 257/415 |
| 2018/0286942 A1* | 10/2018 | Schultz | ............ | H01L 23/5223 |
| 2019/0305076 A1* | 10/2019 | Ando | ............. | H01L 21/76831 |

OTHER PUBLICATIONS

D. Hiller, et al., "Low temperature silicon dioxide by thermal atomic layer deposition: Investigation of material properties", Journal of Applied Physics 107, 064314 (Mar. 29, 2010).

Muhammad Rizwan Amirzada, et al., "Surface roughness analysis of SiO2 for PECVD, PVD and IBD on different substrates", Appl Nanosci 6:215-222 (Feb. 2016).

Muhammad Mustafa Hussain, et al., "Metal Wet Etch Issues and Effects in Dual Metal Gate Stack Integration", Journal of the Electrochemical Society, 153(5) (Mar. 14, 2006) G389-G393.

M. M. Hussain, et al., "Deposition Method-Induced Stress Effect on Ultrathin Titanium Nitride Etch Characteristics", Electrochemical and Solid-State Letters, 9(12) (Oct. 13, 2006).

Muhammad Mustafa Hussain, et al., "Metal Wet Etch Process Development for Dual Metal Gate CMOS", Electrochemical and Solid-State Letters, 8(12) (Oct. 7, 2005) G333-G336.

Li-Ting Liao, "Sol-Gel Derived Synthesis of Monodispersed Silica Nanospheres", DSpace of Feng Chia University, http://dspace.lib.fcu.edu.tw/handle/2377/3756 (Aug. 3, 2007).

* cited by examiner

SEMICONDUCTOR DEVICE AND MANUFACTURING METHOD THEREOF

BACKGROUND

A capacitor is a component in many electronic circuits. A capacitor may consist of first and second conductive electrodes separated by a dielectric insulator layer disposed between the first and second conductive electrodes. Depending on its properties (e.g., capacitance values, temperature drift properties, dynamic range, linearity, equivalent series inductance/resistance, etc.), a capacitor can be used in various radio frequency (RF) circuits (e.g., an oscillator, phase-shift network, filter, converter, etc.), in dynamic random-access memory (DRAM) cells, and as a decoupling capacitor in high power microprocessor units (MPUs). For example, when the output voltage on a CMOS (complementary metal-oxide-semiconductor) device changes between high and low, discharging or charging of a capacitor may be added. Further, a capacitor can be distributed along a chip for other high switching activities, e.g., an arithmetic logic unit (ALU). A capacitor can be also effective on regions with on-chip wiring and when off-chip interconnects are present to minimize signal noise.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
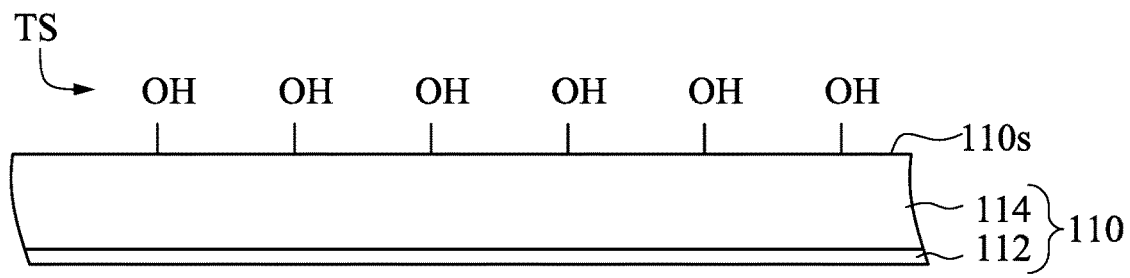
FIGS. 1 to 12 are cross-sectional views of a method for manufacturing a capacitor at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

This disclosure relates to capacitor fabrications and more specifically to large surface area capacitor formations by forming sphere ceramic material and removal of porogens. Because of a rough bottom surface of a top electrode, a capacitor with a larger capacitance value (at least 50% increase) compared to its planar bottom surface with a same projected area can be formed. Such structure and its method does not add area burden to the device and thus enhances an efficient use of substrate area for higher density devices.

FIGS. 1 to 12 are cross-sectional views of a method for manufacturing a capacitor at various stages in accordance with some embodiments of the present disclosure. Reference is made to FIG. 1. A bottom electrode 110 is provided. The bottom electrode 110 may include a bottom barrier layer 112 and a bottom conductive layer 114 formed on the bottom barrier layer 112. In some embodiments, the bottom barrier layer 112 includes a conductive material such as a metal, a metal alloy, or a metal nitride, for example, tantalum nitride (TaN), tantalum (Ta), titanium nitride (TiN), titanium (Ti), cobalt tungsten (CoW), tungsten nitride (WN), or the like. The bottom barrier layer 112 may effectively prevent metal atoms from diffusing into a layer under the bottom barrier layer 112 during a metal deposition process to form the bottom conductive layer 114. In some embodiments, the bottom conductive layer 114 includes a metal material such as, for example, copper (Cu), or the like. In some other embodiments, the bottom conductive layer 114 may include other suitable metal materials (e.g., gold (Au), cobalt (Co), silver (Ag), etc.) and/or conductive materials (e.g., polysilicon) while remaining within the scope of the present disclosure.

In some embodiments, a top surface 110s of the bottom electrode 110 may be terminated with a terminating species TS. In some examples, the terminating species TS is hydroxide (—OH), oxygen (—O), or the like. Termination by hydroxide (—OH) and/or oxygen (—O) can occur, for example, as a result of a cleaning or photoresist stripping process performed on the top surface 110s of the bottom electrode 110 and/or by exposing the top surface 110s of the bottom electrode 110 to a natural environment that contains oxygen. The terminating species TS can be other species, such as hydrogen (—H), nitrogen (—N), ammonia (—NH$_3$), or the like, such as depending on a cleaning and/or stripping process that is performed on the top surface 110s.

In some embodiments, the top surface 110s of the bottom electrode 110 initially carries the terminating species TS. That is, the bottom electrode 110 includes terminating species TS itself. In some other embodiments, the top surface 110s of the bottom electrode 110 has high affinity to precursors A1 (see FIGS. 2A and 2B), such that the precursors A1 will be absorbed on the top surface 110s. In still some other embodiments, the top surface 110s is initially neutral, and a surface treatment (e.g., the cleaning and/or stripping process mentioned above) can be performed on the top surface 110s to change or modify the surface termination.

Figure 2A:
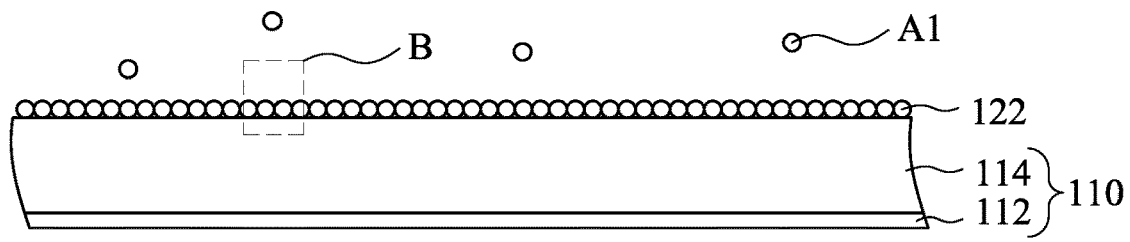
Figure 2B:
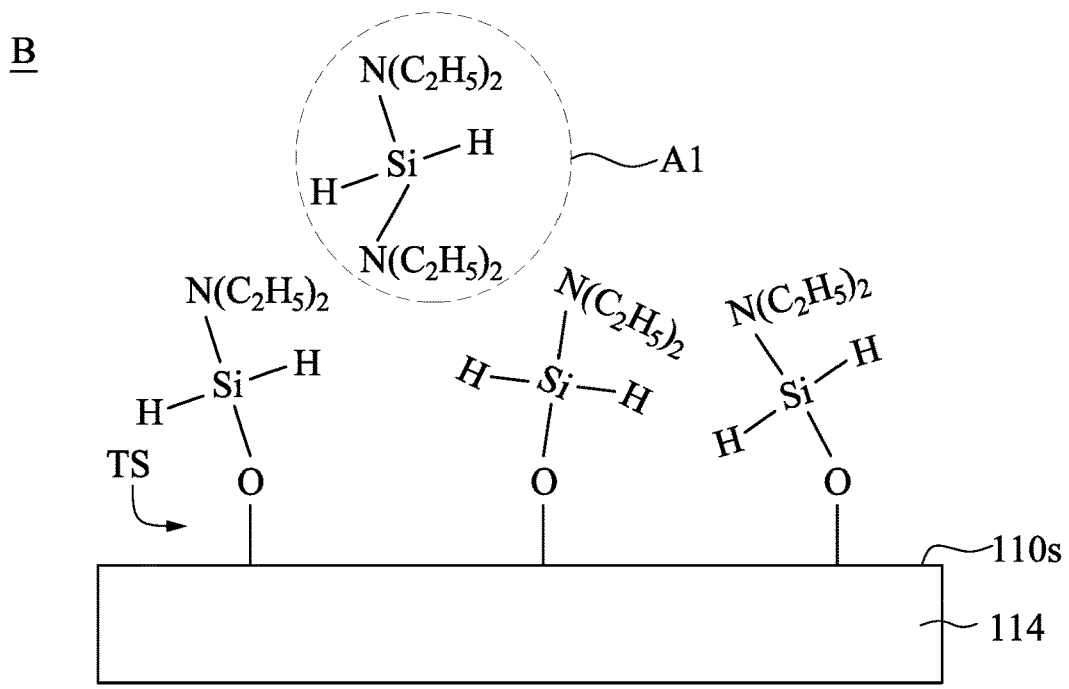

Reference is made to FIGS. 2A and 2B, where FIG. 2B is an enlarged view of area B in FIG. 2A. Then, a dielectric film 122 is formed over the bottom electrode 110. The dielectric film 122 is formed using a deposition technique that can form a monolayer, such as atomic layer deposition (ALD). ALD is an approach to filling dielectrics that involves depositing a monolayer of precursor over the bottom electrode 110, purging the chamber, and introducing a reactant that reacts with the precursor to leave a monolayer of product. The cycle can be repeated many times to build a layer with a sufficient thickness to be functional. In FIGS. 2A and 2B, the dielectric film 122 can be a monolayer (i.e., one cycle is performed) or multilayers (i.e., multiple cycles are performed). The surface roughness of the dielectric film 122 is about 2.5 nm to about 1 nm when the dielectric film 122 is formed by using ALD.

During the ALD process, the bottom electrode 110 is positioned on a chuck in an ALD process chamber. A vacuum is then applied to the ALD process chamber to remove oxygen and moisture and the temperature is raised to an acceptable level that is suitable for the ALD deposition. Precursors A1 including a reactive compound such as Si surrounded by organic ligands or other suitable substituents, e.g. $-N(C_2H_5)_2$, $-OCH_3$, $-H$, or the like, are then fed into the ALD process chamber. This causes a chemical reaction in which a substituent is removed from the precursors A1 and replaced with a bond between the reactive compound (e.g., Si atom) in the precursors A1 and the terminating species TS (e.g., hydroxyl group) of the top surface 110s of the bottom electrode 110. Such a reaction may change the oxidation state of the element of the precursors A1. The reaction may be driven by the fact that the Si-ligand bond is a relatively weak bond, with Si having a higher affinity for binding to an oxygen atom, such that the overall Gibbs free energy ($\Delta G$) of the reaction is negative. The effective coverage of the top surface 110s with the precursors A1 depends on a number of factors, such as ligand size and duration of the exposure of the top surface 110s. In some embodiments, the precursor A1 may be $C_8H_{22}N_2Si$, Methyldiethoxysilane (Di Ethoxy Methyl Silane), or other suitable materials.

Figure 3:
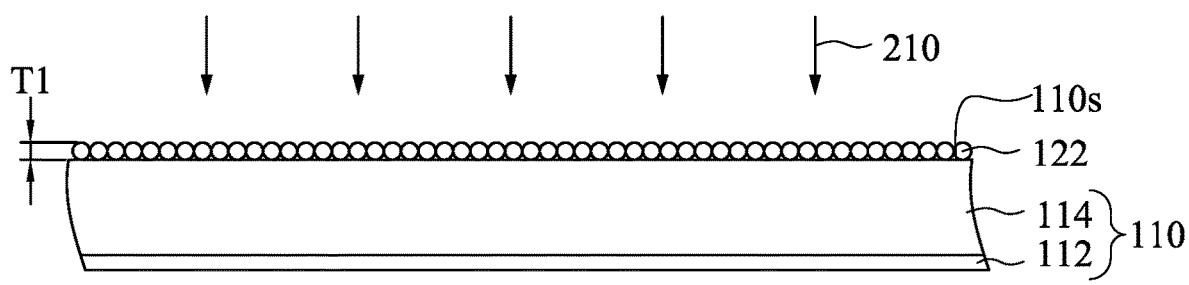

Reference is made to FIG. 3. Then, residual precursors A1 (see FIGS. 2A and 2B) are discharged from the reaction chamber for a period of time. To more effectively discharge the residual precursors A1 from the ALD process chamber, purge gas may be injected into the ALD process chamber during this purging period, wherein the purge gas may include a substantially inert gas such as $N_2$, Ar, He, or similar inert gases.

Then, a decomposition process 210 of the precursors A1 is performed. For example, the bottom electrode 110 may be exposed to an oxide source, e.g. $H_2O$, $O_3$, plasma-generated oxygen radicals (which is a plasma treatment) or another suitable oxygen source, which replaces the remaining substituents of the precursors A1 with oxygen, thereby forming the dielectric film 122 over the top surface 110s. In some other embodiments, the bottom electrode 110 may be exposed to a nitrogen source (such as $NH_3$), a carbon source, or other suitable sources to form the dielectric film 122. In some embodiments, the dielectric film 122 has a thickness T1 in a range of from about 0.06 nm to about 20 nm. With such thickness, the thickness T of the insulator layer I (see FIG. 11) can be reduced. If the thickness T1 of the dielectric film 122 is greater than about 20 nm, the precursors A1 may suffer inefficiently decomposition.

In some other embodiments, the decomposition process 210 may be a thermal process. That is, the bottom electrode 110 is heated to a suitable temperature (e.g., lower than a processing temperature for a plasma treatment, such as in a range of about 0° C. to about 500° C.) such that the precursors A1 are decomposed without providing oxygen or other sources or performing a plasma process. Specifically, when the temperature of the precursors A1 reaches their decomposition temperatures, the precursors A1 break down and the reactive compound (e.g., Si atoms) are free to deposit on the heated bottom electrode 110. If the bottom electrode 110 is maintained at a sufficiently high temperature, the dielectric film 122 deposition proceeds.

Figure 4:
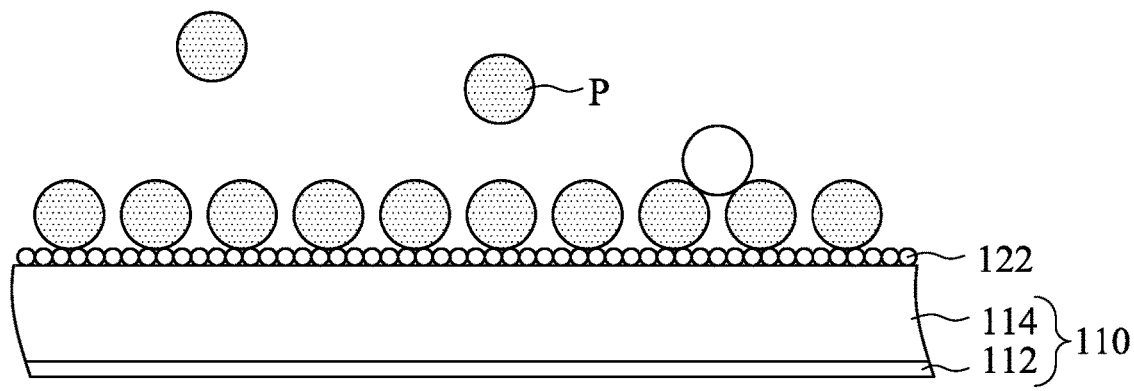
Figure 11:
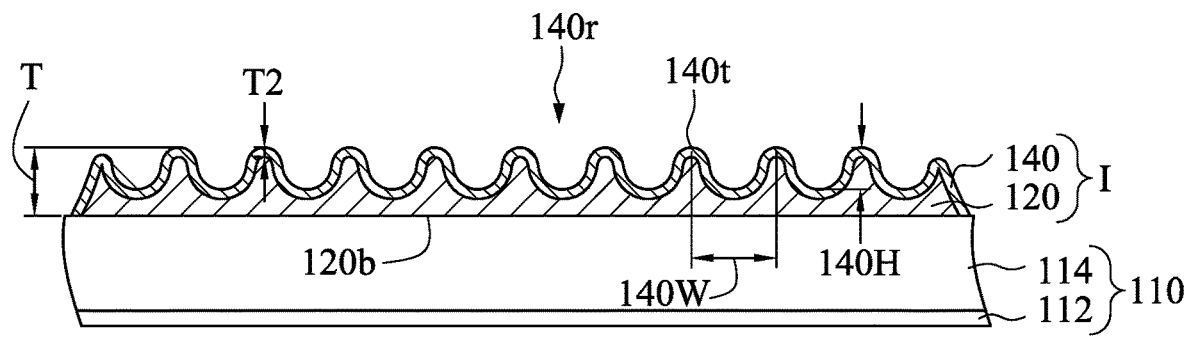

Reference is made to FIG. 4. Plural porogens P are formed over the bottom dielectric film 122. The porogens P may be a molecule that can be removed from the dielectric films 122 and 124 (see FIG. 6A) after the dielectric films 122 and 124 have set in order to form pores therebetween. The porogens P may be a material that is big enough to form the pores while also remaining small enough such that the size of the individual pores does not overly displace the dielectric films 122 and 124. As such, the porogens P may include an organic molecule that includes one or more ring structures within the individual molecules of the porogens P. Additionally, in order to reduce the size of the individual pores, the individual molecules of the porogens P may have a small ring or small mass. By using a ring structure and having a small mass, the size of the individual pores that will be formed once the porogens P are removed may be tailored to increase the surface roughness of the insulator layer I (FIG. 11).

In some embodiments, the porogens P may be a cyclic, non-aromatic, small mass, and single bonded molecule such as cyclooctane, which has a non-aromatic ring structure with eight carbon atoms and has single bonds throughout the ring structure. However, any suitable molecule that has one or more ring structures, a large percentage of single bonds between the atoms, and a small mass, such as cycloheptane, cyclohexane, cyclodiene, may alternatively be utilized. Additionally, one or more functional groups, such as a methyl group ($-CH_3$), an ethyl group ($-C_2H_5$), an isopropyl group ($-C_3H_7$) or the like may be linked at the side of the ring structure. In some other embodiments, the porogens P may be alpha-Terpinene (ATRP), beta-Terpinene, gamma-Terpinene, or the like. These and all other suitable porogens as described herein are fully intended to be included within the scope of the embodiments.

The porogens P can be spread into a chamber in a pressure range of from about 1 mTorr to about 9000 mTorr. With this pressure range, the porogens P can be in monomer forms to minimize the sizes thereof. If the pressure is out of this range, the porogens P may be absorbed together to form droplets, and the size of the porogens P are increased. Also, the sizes of pores 130 (see FIG. 9) are increased. The greater the pore size, the less roughness the top surface of following formed dielectric structure 120 (FIG. 10). The porogens P may be absorbed on the dielectric film 122 with Van der Waals force or be bond to the dielectric film 122, depending on the material of the porogens P. For example, if the porogens P include hydrogen bonds, the hydrogen of the porogens P can bond to hydroxide ($-OH$) of the dielectric film 122 to form $H_2O$, which will be released from the porogens P and the dielectric film 122. Hence, the porogens P are bond to the dielectric film 122.

In some embodiments, the deposition of the porogens P and the formation of the dielectric film 122 can be performed in different chambers. This configuration prevents excess porogens P pollute the ALD chamber if the porogens P are adhesive. In some other embodiments, however, the deposition of the porogens P and the formation of the dielectric film 122 can be performed in the same chamber, i.e., the ALD chamber.

Figure 5:
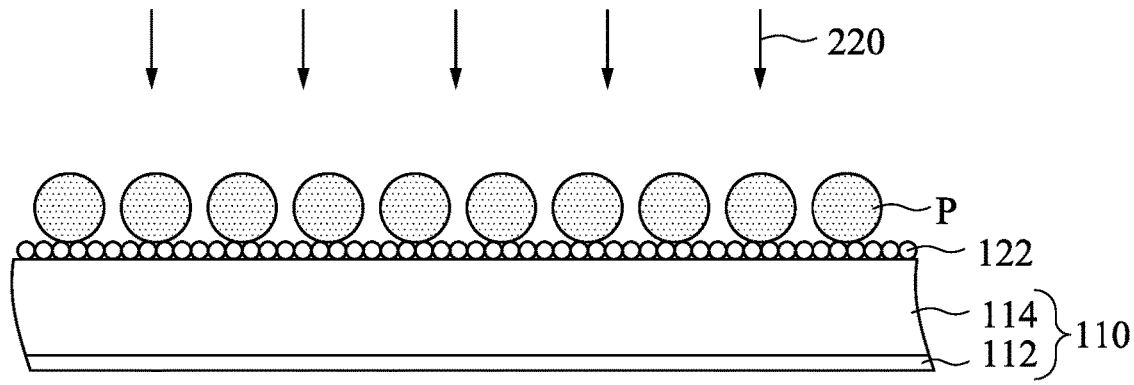

Reference is made to FIG. 5. The excess porogens P (which are not absorbed on the dielectric film 122) are removed out of the chamber. For example, a thermal treatment 220 is performed on the porogens P to vapor the excess porogens P. Specifically, an affinity between the porogen B and the dielectric film 122 is stronger than an affinity between the porogens P. As such, when the thermal treatment 220 is performed on the porogens P, a portion of the porogens P which are not absorbed on the dielectric film 122 are released and then vapor, and another portion of the porogens P which are absorbed on the dielectric film 122 remain on the dielectric film 122. The thermal treatment 220 can be a plasma treatment, a heating process, an irradiating treatment, or other suitable treatments. Furthermore, the removal of the excess porogens P may be the thermal treatment 220 with a purging process to purging out the excess porogens P. In some other embodiments, the density of the porogens P can be modified by tuning the concentration of the porogens P, the pressure and the temperature of the chamber, the purging time, or other parameters. With such configuration, the remaining porogens P are mostly monomers.

Figure 6A:
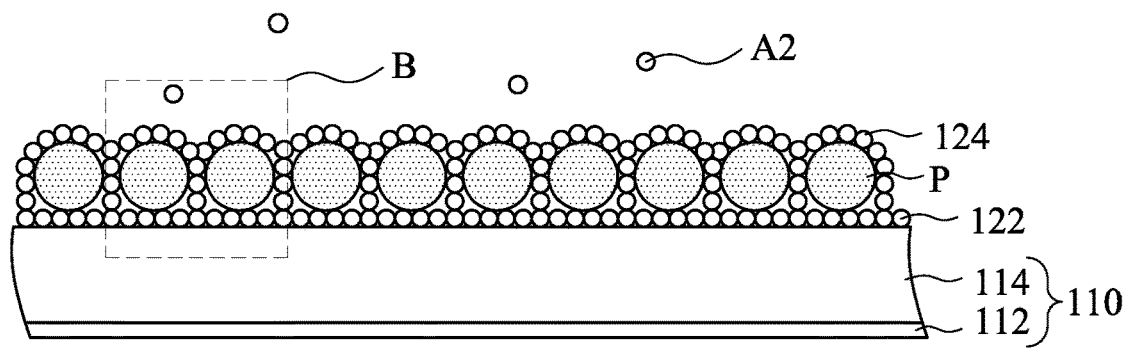
Figure 6B:
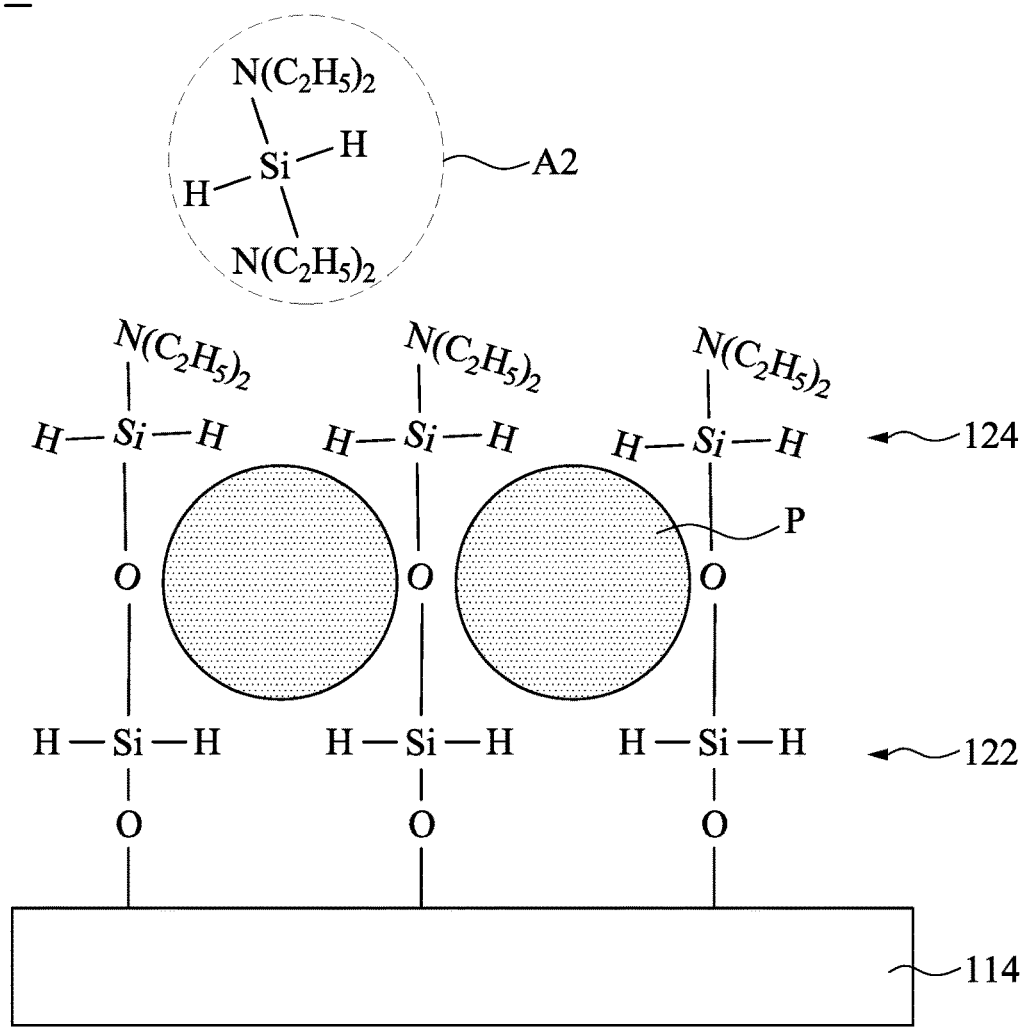

Reference is made to FIGS. 6A and 6B, where FIG. 6B is an enlarged view of area B in FIG. 6A. Then, another dielectric film 124 is formed over the dielectric film 122 and the porogens P. The dielectric film 124 is formed using a deposition technique that can form a monolayer, such as ALD. Precursors A2 including a reactive compound such as Si surrounded by organic ligands or other suitable substituents, e.g. —N(C$_2$H$_5$)$_2$, —OCH$_3$, —H, or the like, are then fed into the ALD process chamber. This causes a chemical reaction in which a substituent is removed from the precursors A2 and replaced with a bond between the reactive compound (e.g., Si atom) in the precursors A2 and the substituent (e.g., hydroxyl group) of the precursors A1 and/or the porogens P. In some embodiments, the precursor A2 may be C$_8$H$_{22}$N$_2$Si, Methyldiethoxysilane (Di Ethoxy Methyl Silane), or other suitable materials. In some embodiments, the precursor A1 and A2 are the same. In some other embodiments, the precursors A2 may have a material different from the precursors A1. The surface roughness of the dielectric film 124 is about 2.5 nm to about 1 nm when the dielectric film 122 is formed by using ALD.

In FIGS. 6A and 6B, since the precursors A2 are small enough, the precursors A2 can be deposited between spaces among the porogens P, such that the porogens P are surrounded (or wrapped) by the precursors A2, i.e., the precursors A2 separate the porogens P. Hence, the number of the pores 130 (see FIG. 9) is substantially the same as the molecule number of the porogens P. Furthermore, the precursors A2 can be bond to the dielectric film 122 through the spaces.

Figure 7:
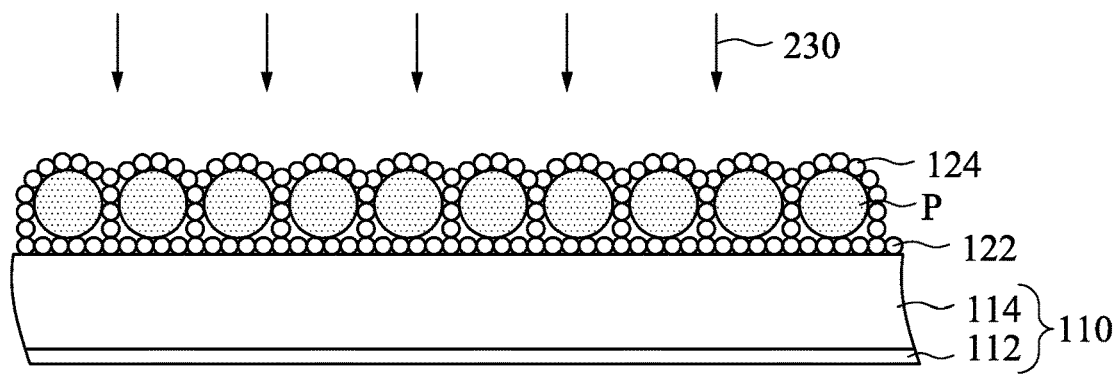

Reference is made to FIG. 7. The residual precursors A2 (FIGS. 6A and 6B) are purged out of the chamber. Then, a decomposition process 230 is performed. For example, the bottom electrode 110 may be exposed to an oxide source, e.g. H$_2$O, O$_3$, plasma-generated oxygen radicals or another suitable oxygen source (which is a plasma treatment), which replaces the remaining substituents of the precursors A2 with oxygen, thereby forming the dielectric film 124 over the dielectric film 122 and the porogens P. In some other embodiments, the bottom electrode 110 may be exposed to a nitrogen source (such as NH$_3$), a carbon source, or other suitable sources to form the dielectric film 124. In some other embodiments, the decomposition process 230 may be a thermal process. That is, the bottom electrode 110 is heated to a suitable temperature (e.g., lower than a processing temperature for a plasma treatment, such as in a range of about 0° C. to about 500° C.) such that the precursors A2 are decomposed without providing oxygen or other sources or performing a plasma process.

Figure 8:
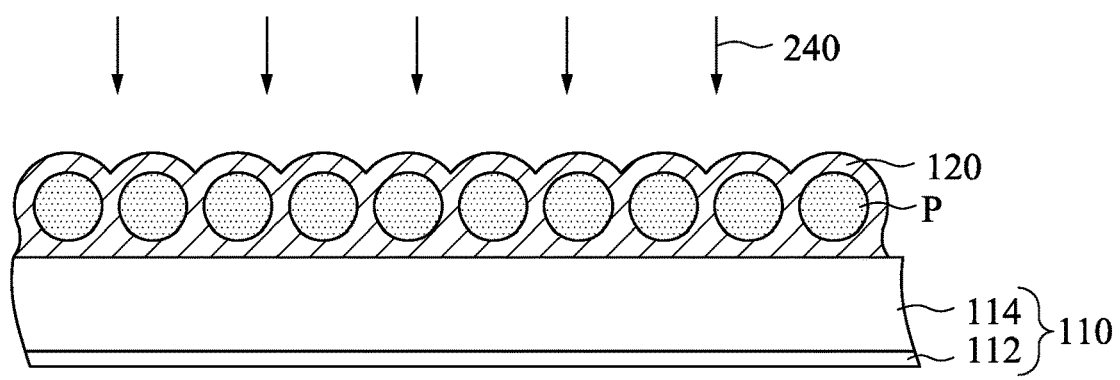

Reference is made to FIG. 8. A condensation process 240 is performed on the dielectric films 122 and 124 to form a dielectric structure 120 that surrounds the porogens P. The condensation process 240 is the exposure of the dielectric films 122 and 124 to a hydrolyzing agent and a solvent. The dielectric films 122 and 124 are exposed to the hydrolyzing agent (e.g., water). The dielectric films 122 and 124 undergo a reaction (Eq. 1) to produce the intermediate product (Si—OH), and R—OH as a byproduct.

$$\text{Si—OR} + \text{H}_2\text{O} \rightarrow \text{Si—OH} + \text{R—OH} \qquad \text{(Eq. 1)}$$

Additionally, the dielectric films 122 and 124 and the intermediate product (Si—OH) may also undergo a series of condensation reactions (in the solvent) such as the chemical reactions illustrated in Equations 2 and 3 below. In some embodiments, the solvent is alcohol (R—OH) or other suitable acidic reagent.

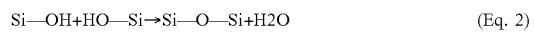

$$\text{Si—OH} + \text{HO—Si} \rightarrow \text{Si—O—Si} + \text{H}_2\text{O} \qquad \text{(Eq. 2)}$$

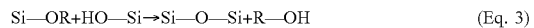

$$\text{Si—OR} + \text{HO—Si} \rightarrow \text{Si—O—Si} + \text{R—OH} \qquad \text{(Eq. 3)}$$

After the condensation process 240, the dielectric films 122 and 124 are condensed to be the dielectric structure 120, which may be a polymer material. In some embodiments, the polymer material is ceramic ((Si—O—Si)n), which is denser than the dielectric films 122 and 124.

Figure 9:
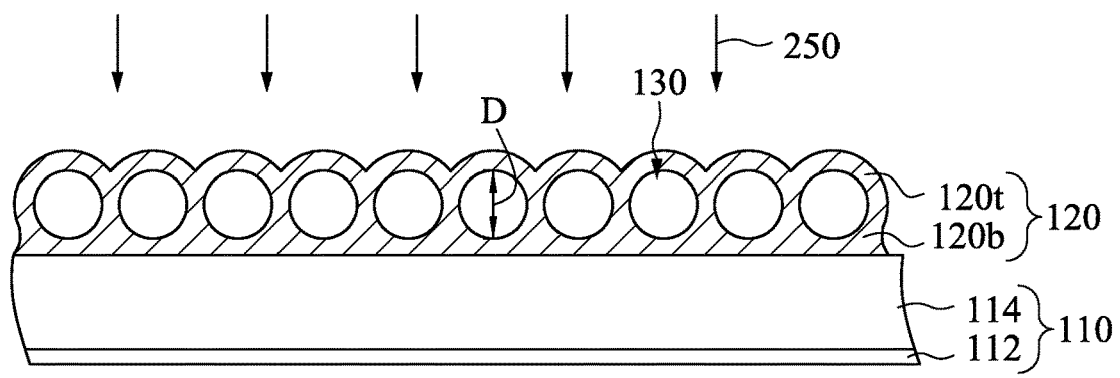
Figure 10:
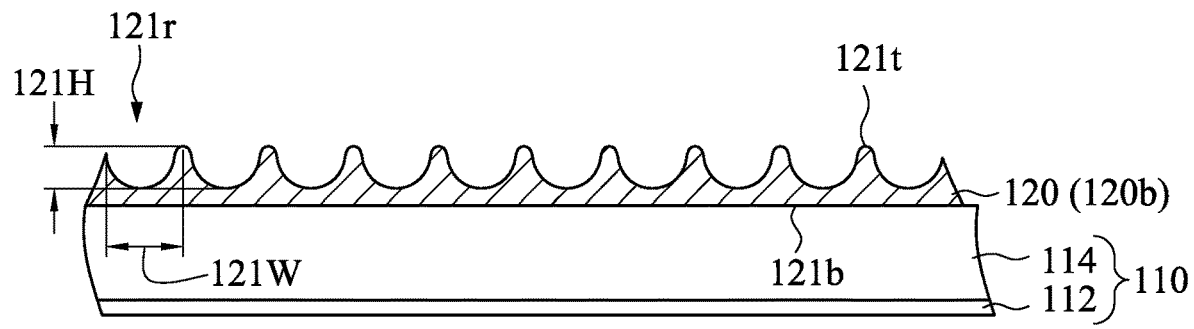

Reference is made to FIG. 9. The porogens P (see FIG. 8) are removed to form a plurality of pores 130 in the dielectric structure 120. The removal process 250 of the porogens P may be performed by a thermal process which can break down and vaporize the porogens P, thereby allowing the porogens P to diffuse and leave the dielectric structure 120, thereby leaving behind a structurally intact porous dielectric material as the dielectric structure 120. Since the dielectric structure 120 is thin enough (e.g., monolayer or a few atomic layers), the porogens P can be effectively removed. That is, the dielectric structure 120 prevents the porogens P from remaining in the dielectric structure 120.

However, as one of ordinary skill in the art will recognize, the removal process 250 described above is not the only method that may be utilized to remove the porogens P from the dielectric structure 120. Other suitable processes, such as irradiating the porogens P with UV radiation to decompose the porogens P, or utilizing microwaves or e-beam to decompose the porogens P, may alternatively be utilized. These and any other suitable process to remove all or a portion of the porogens P are all intended to be included within the scope of the embodiments.

Some other embodiments the removal process 250 includes an UV treatment using a UV source to irradiate the porogens P with UV radiation. The UV source may include a broad beam (BB) UV source. Embodiments may further include using a monochronomator, diffraction grating, or, a filter to selectively remove undesired wavelengths from the UV radiation. The UV treatment decomposes the porogens P, thereby forming the pores 130 in the dielectric structure 120.

The dielectric structure 120 has a pore size D of from about 3 nm to about 10 nm and a volume percentage porosity of from about 10% to about 75%. As mentioned above, since the porogens P are almost in monomer forms, the pore sizes D are substantially uniform.

Reference is made to FIG. 10. The dielectric structure 120 is partially removed. Specifically, the dielectric structure 120 includes a top portion 120t (FIG. 9) and a bottom portion 120b. A removal process is performed to remove the top portion 120t of the dielectric structure 120. Since the dielectric structure 120 and the bottom electrode 110 are different materials, the etching process has good etching selectivity between the dielectric structure 120 and the bottom electrode 110. The top portion 120t may be removed by performing an etching process. In some embodiments, the etching process is an atomic layer etching (ALE) process. ALE technology enables the controlled removal of material from a substrate, layer-by-layer, where the etching thickness is on the order of magnitude of a monolayer. Self-limited reaction is a characteristic of ALE. Adsorption and desorption operations are self-limited at a maximum rate equivalent to monolayer per cycle. Specifically, the ALE reaction cycle sequentially includes forming an adsorption monolayer including an etchant on an exposed surface of a substrate, purging the chamber to remove the excess etchant that does not react with the substrate, desorbing the adsorption monolayer by exposing the adsorption monolayer to gas ions to activate a reaction of the etchant, and purging the chamber to remove the desorbed monolayer. The total amount of material removed is determined by the number of repeated reaction cycles. As such, the etching thickness of the material can be well controlled. The enchant in every cycle can be the same or different. In some other embodiments, however, the etching process is a dry etching process.

After the removal process, the top portion 120t of the dielectric structure 120 is removed, and the bottom portion 120b of the dielectric structure 120 remains on the bottom electrode 110. Specifically, the bottom portion 120b is in contact with the bottom electrode 110. A top surface 121t of the dielectric structure 120 is rougher than a bottom surface 121b of the dielectric structure 120, and the bottom surface 121b is flatter than the top surface 121t. In greater detail, since the bottom conductive layer 114 is planarized, and the dielectric structure 120 is in contact with the bottom conductive layer 114, the bottom surface 121b is substantially flat. In contrast, since the bottom portion 120b is formed by removing the porogens P (FIG. 8), the top surface 121b is uneven. Stated in another way, the top surface 121b has a plurality of recesses 121r, which correspond to the pores 130 shown in FIG. 9. The recess 121r has a width 121W in a range of about 0.1 nm to about 0.3 nm, and has a height 121H in a range of about 0.05 nm to about 0.2 nm.

The top surface 121t is an uneven surface with properties such as roughness and recess depth which are factors that affect the effective plate area of a capacitor. For roughness, there are several parameters adopted to measure the degree of the roughness, roughness average (Ra) may be used in the present disclosure. The definition of Ra is defined as the average of absolute deviation from the height mean value (Rm) within an area. The Ra of the whole area of the top surface 121t is called as a global Ra, or called GRa, however, the Ra of a portion of the whole area of the top surface 121t is called as a localized roughness, or called LRa in the present disclosure. A surface with a greater Ra (or GRa) indicates that the surface is rougher or more uneven in comparison with a surface with a smaller Ra (or GRa).

Reference is made to FIG. 11. A high-k dielectric layer 140 is conformally formed on the bottom portion 120b of the dielectric structure 120. In some embodiments, the formation method of the high-k dielectric layer 140 is ALD. However, other methods such as plasma enhanced chemical vapor deposition (PECVD), low-pressure chemical vapor deposition (LPCVD), metal-organic chemical vapor deposition (MOCVD), plasma enhanced atomic layer deposition (PEALD), and the like, may also be used. In some embodiments, the high-k dielectric layer 140 includes hafnium oxide ($HfO_2$) or else a silicate oxide such as $HfSiO_x$. In alternative embodiments, the high-k dielectric layer 140 includes other hafnium-containing materials such as $HfZrO_x$, $HfAlO_x$, $HfLaO_x$, $HfTiO_x$, $HfTaO_x$, $HfTiTaO_x$, or combinations thereof. In yet other embodiments, the high-k dielectric layer 140 includes metal oxides such as $LaO_3$, $ZrO_2$, $Al_2O_3$, $Ta_2O_5$, $TiO_2$, or combinations thereof. The k value of the high-k dielectric layer 140 may be greater than about 7. The high-k dielectric layer 140 may have a thickness T2 of about 0.1 nm to about 2 nm, which is determined by the desired capacitance value of the resulting capacitor. In some embodiments, a dielectric constant of the high-k dielectric layer 140 is higher than a dielectric constant of the dielectric structure 120.

In FIG. 11, the high-k dielectric layer 140 and the bottom portion 120b of the dielectric structure 120 form an insulator layer I of a capacitor. The insulator layer I may have a thickness T of about 0.16 nm to about 22 nm, which depends on the desired capacitance value. Since the high-k dielectric layer 140 is conformally formed on the bottom portion 120b of the dielectric structure 120, the top surface 140t of the high-k dielectric layer 140 have the similar (or same) shape to the top surface 121t of the bottom portion 120b of the dielectric structure 120. That is, the bottom surface 120b of the dielectric structure 120 is flatter than the top surface 140t of the high-k dielectric layer 140, and the top surface 140t is rougher than the bottom surface 120b. The top surface 140t of the high-k dielectric layer 140 has a plurality of recesses 140r. The recess 140r has a width 140W in a range of about 0.1 nm to about 0.3 nm, and has a height 140H in a range of about 0.05 nm to about 2 nm. Moreover, since the high-k dielectric layer 140 has a high k value, the thickness T can be reduced compared to a capacitor having a low-k dielectric material. With the reduced thickness, the formed capacitor in this embodiment has high capacitance value in a small layout area.

Figure 12:
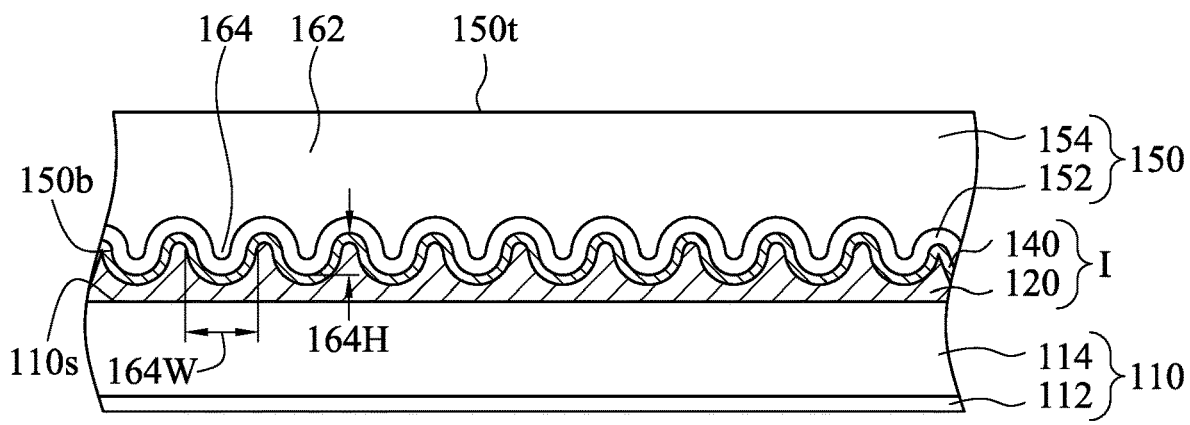

Reference is made to FIG. 12. A top electrode 150 is formed on the insulator layer I (i.e., the high-k dielectric layer 140) to form a capacitor 100. That is, the high-k dielectric layer 140 is in contact with the dielectric structure 120 and the top electrode 150. The top electrode 150 includes a top barrier layer 152 and a top conductive layer 154 formed on the top barrier layer 152. In some embodiments, the top barrier layer 152 includes a conductive material such as a metal, a metal alloy, or a metal nitride, for example, tantalum nitride (TaN), tantalum (Ta), titanium nitride (TiN), titanium (Ti), cobalt tungsten (CoW), tungsten nitride (WN), or the like. The top barrier layer 152 may effectively prevent metal atoms from diffusing into the high-k dielectric layer 140 during a metal deposition process to form the top conductive layer 154. In some embodiments, the top conductive layer 154 includes a metal material such as, for example, copper (Cu), or the like. In some other embodiments, the top conductive layer 154 may include other suitable metal materials (e.g., gold (Au), cobalt (Co), silver (Ag), etc.) and/or conductive materials (e.g., polysilicon) while remaining within the scope of the present disclosure.

The top barrier layer 152 is conformally formed on the high-k dielectric layer 140. After the formation of the top barrier layer 152, a seed layer (not shown) may be formed on the top barrier layer 152. The seed layer may be made of copper or other suitable materials. The top conductive layer 154 is then formed on the seed layer by using electroless plating, electrochemical plating, or the like. The top conductive layer 154 is then planarized, e.g., using a chemical mechanical polish (CMP).

The top electrode 150 has a top surface 150t and a bottom surface 150b opposite to the top surface 150t. The bottom surface 150b is rougher than the top surface 150t, and the top surface 150t is flatter than the bottom surface 150b. Specifically, since the top conductive layer 154 is planarized, the top surface 150t is substantially flat. In contrast, since the top barrier layer 152 is conformally formed on the high-k dielectric layer 140, the bottom surface 150b is uneven. Stated in another way, the top electrode includes a base 162 and a plurality of bumps 164 protruding from the base 162 and towards the insulator layer I. That is, the bumps 164 are respectively in the recess 140r (FIG. 11) of the high-k dielectric layer 140 (i.e., the insulator layer I). The bump 164 has a width 164W in a range of about 0.05 nm to about 0.25 nm, and has a height 164H in a range of about 0.05 nm to about 2 nm. Also, the bottom surface 150b of the top electrode 150 is rougher than the top surface 110s of the bottom electrode 110, and the top surface 110s is flatter than the bottom surface 150b.

According to some embodiments, a parallel-plate capacitor with high effective plate area is provided. The insulator layer of the capacotor is formed by performing a bottom dielectric film deposition, deposition of porogens, performing a top dielectric film deposition, condensing the dielectric films, and then removal of the porogens. The dielectric films can be formed by performing ALD process. Since the dielectric films are ALD layers, the insulator layer has small thickness to reduce the whole size of the capacitor. Furthermore, the precursors are small enough to be disposed between the spaces among the porogens, so that the dielectric film can wrap the individual porogens and is in contact with the underlying dielectric film. With such a configuration, the resulting insulator layer has high surface roughness. Because of a rough top surface of the insulator layer (i.e., a rough bottom surface of a top electrode of the capacitor), a capacitor with a larger capacitance value compared to its planar bottom surface with a same projected area can be formed. Such structure and its method does not add area burden to the device and thus enhances an efficient use of substrate area for higher density devices.

The present disclosure will now be described with respect to some embodiments in a specific context, namely the creation of high capacitance capacitors in a semiconductor device process. It is believed that embodiments described herein will benefit other applications not specifically mentioned. Therefore, the specific embodiments discussed are merely illustrative of specific ways to make and use the disclosure, and do not limit the scope of the disclosure.

Figure 13:
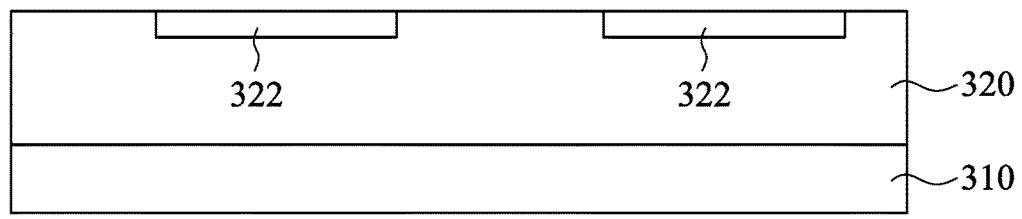
FIGS. 13 to 16 are cross-sectional views of a method for manufacturing a semiconductor device at various stages in accordance with some embodiments of the present disclosure.

FIGS. 13 to 16 are cross-sectional views of a method for manufacturing a semiconductor device at various stages in accordance with some embodiments of the present disclosure. Reference is made to FIG. 13. A semiconductor substrate 310 is provided. The semiconductor substrate 310 may include, for example, bulk silicon, doped or undoped, or an active layer of a semiconductor-on-insulator (SOI) substrate. In some embodiments, an SOI substrate includes a layer of a semiconductor material, such as silicon, formed on an insulator layer. The insulator layer may be, for example, a buried oxide (BOX) layer or a silicon oxide layer. The insulator layer is provided on a substrate and may be a silicon or glass substrate. Other substrates, such as a multi-layered or gradient substrate may also be used.

In some embodiments, a semiconductor structure 320 is formed on the semiconductor substrate 310 and may be some types of circuitry suitable for a particular application. In some embodiments, the semiconductor structure 320 includes electrical devices formed on the semiconductor substrate 310 with one or more dielectric films overlying the electrical devices. Metal layers may be formed between overlying dielectric films, such as those discussed herein, to route electrical signals between the electrical devices. Electrical devices may also be formed in one or more dielectric films.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

At least one conductive element 322 is formed in the semiconductor structure 320. The conductive element 322 may be formed by, for example, creating openings in the semiconductor structure 320 using photolithography techniques. In some embodiments, photolithography techniques involve applying a photoresist material (not shown) and exposing the photoresist material in accordance with a desired pattern. The photoresist material is then developed to remove a portion of the photoresist material, thereby exposing the underlying material in accordance with the desired pattern. The remaining photoresist material protects the underlying material from subsequent processing operations, such as etching, performed to form the opening in which the conductive element 322 is to be formed in the semiconductor structure 320. The etching process may be a wet or dry, anisotropic or isotropic, etch process, such as an anisotropic dry etch process. After the opening is formed in the semiconductor structure 320, a conductive material may be deposited to fill the openings to form the conductive elements 322. The conductive element 322 may include metals, elemental metals, transition metals, or the like, such as a copper interconnect.

Figure 14:
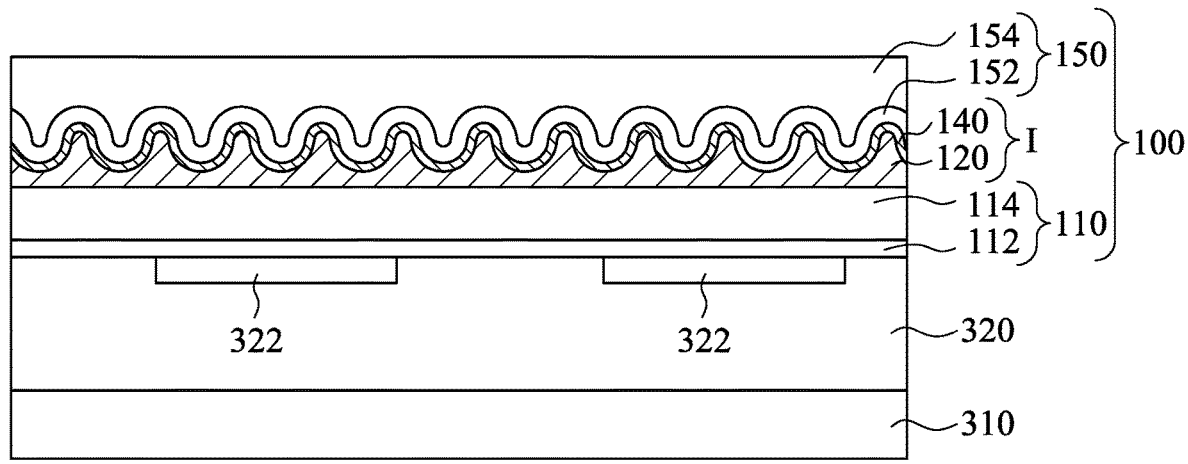

Reference is made to FIG. 14. Over the semiconductor structure 320 is a capacitor layer 100 in accordance with some embodiments. Since the formation of the capacitor layer 100 is similar to that of the capacitor mentioned in FIGS. 1 to 12, and thus a description thereof is omitted.

Figure 15:
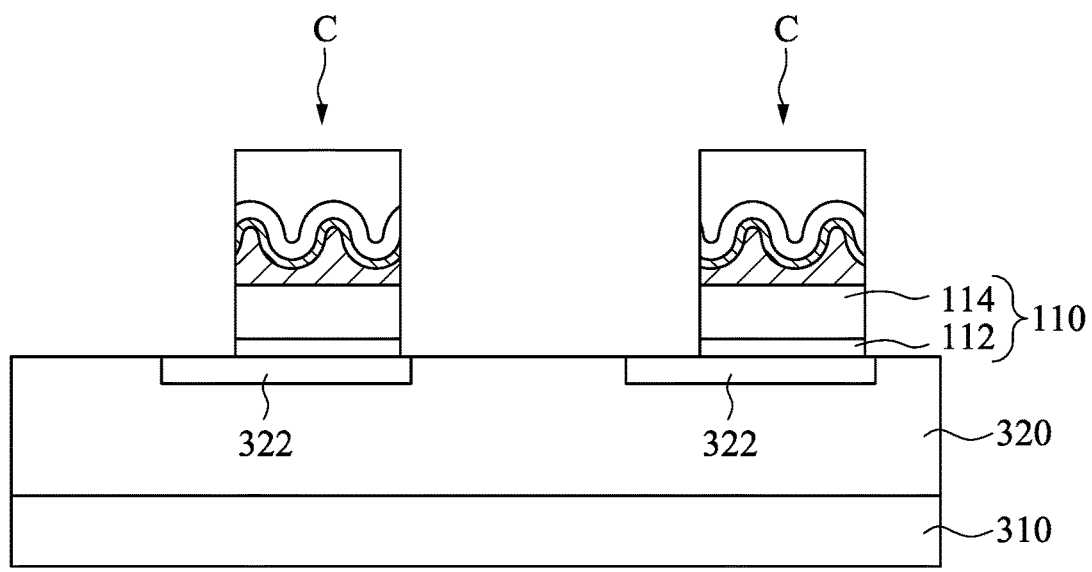

Reference is made to FIG. 15. The capacitor layer 100 of FIG. 14 is patterned to be at least one capacitor C. For example, in FIG. 15, two capacitors C are formed on the semiconductor structure 320. The bottom electrodes 110 of the capacitors C are respectively in contact with the conductive elements 322, such that the capacitors C are electrically connected to the conductive elements 322, respectively. In some embodiments, the capacitor layer 100 may be patterned by using a lithoghaphy and then etching process.

The etching process may be a dry etching process, a wet etching process, or combinations thereof.

Figure 16:
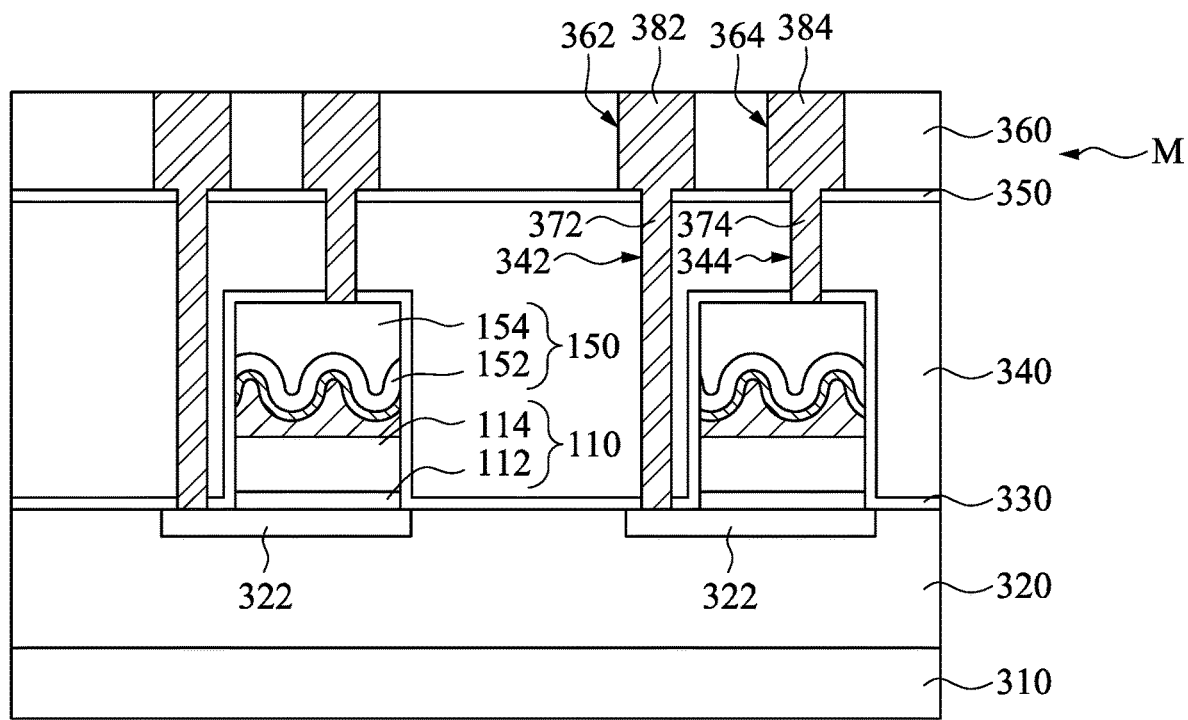

Reference is made to FIG. 16. An etch stop layer (ESL) 330 is blanket (conformally) formed on the structure of FIG. 15, i.e., the capacitors C and the semiconductor structure 320, an interlayer dielectric (ILD) 340 is formed on the ESL 330, and then another ESL 350 is formed on the ILD 340. In some embodiments, the ESLs 330 and 350 are formed of silicon nitride, for example, although other dielectric materials may be used. In some embodiments, the ILD 340 is formed of an oxide such as Un-doped Silicate Glass (USG), Fluorinated Silicate Glass (FSG), a low-k oxide, or the like.

Then, the ESLs 330, 350 and the ILD 340 are patterned, followed by the etching of the ESL 330, 350 and the ILD 340. As a result, openings 342 and 344 are formed. Then, another ILD 360 is formed over the ESL 350 and in the openings 342 and 344. Since the material of the ILD 360 is similar to the material of ILD 340, and thus a description thereof is omitted.

Openings 362 and 364 are formed through the patterning of the ILD 360. The dielectric materials in the openings 342 and 344 are also removed. In a subsequent operation, a metallic material, which may include copper or a copper alloy, is filled into openings 342, 344, 362, and 364. Next, a planarization such as a chemical mechanical polish (CMP) is performed to remove the excess metal over the openings 362 and 364, leaving metal lines 382 in the openings 362, contact plugs 372 in the openings 342, metal lines 384 in the openings 364, and contact plugs 374 in the openings 344. The metal lines 382 and the contact plugs 372 are connected to the bottom electrodes 110 of the capacitor C through the conductive elements 322, and the metal lines 384 and the contact plugs 374 are connected to the top electrodes 150 of the capacitor C. In some embodiments, the combinations of the metal lines 382 and 384, the contact plugs 372 and 374, the ILD 360 and the ESL 350 are referred to as an interconnection layer M. The metal lines 382 and 384 may be connected to each other in some embodiments.

Figure 17:
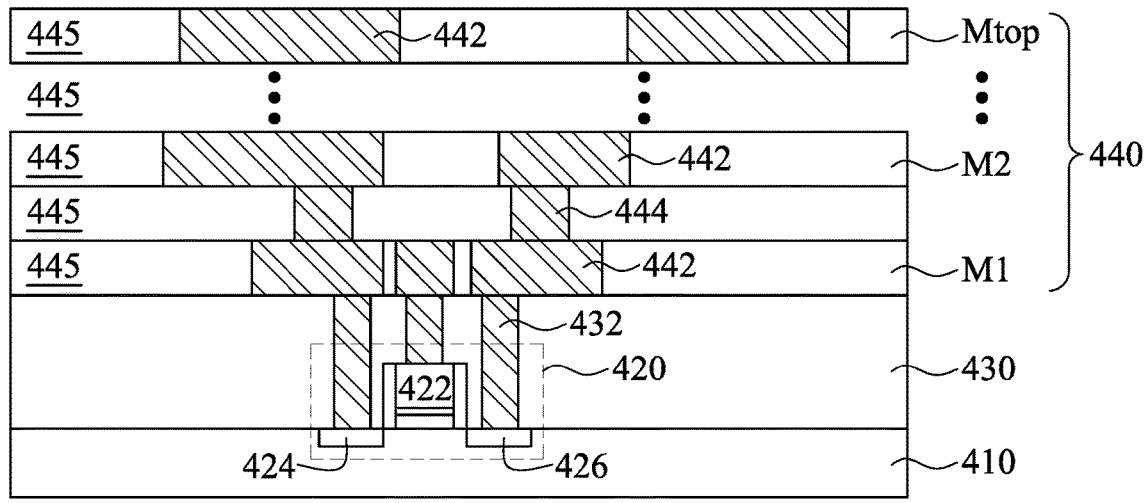
FIGS. 17 to 20 are cross-sectional views of a method for manufacturing a semiconductor device at various stages in accordance with some embodiments of the present disclosure.

FIGS. 17 to 20 are cross-sectional views of a method for manufacturing a semiconductor device at various stages in accordance with some embodiments of the present disclosure. Reference is made to FIG. 17. A semiconductor substrate 410 is provided. The semiconductor substrate 410 is similar to the semiconductor substrate 310 of FIG. 13, and thus a description thereof is omitted. Contact plugs 432 are formed in an ILD 430, and may be electrically coupled to a device 420. In some embodiments, the device 420 is a transistor including a gate 422, a source 424, and a drain 426.

Interconnection structure 440, which includes metal lines 442 and vias 444 therein and electrically coupled to the device 420, is formed over the ILD 430. The metal lines 442 and vias 444 may be formed of metal, such as copper or copper alloys, and may be formed using the single and/or dual damascene processes. The interconnection structure 440 includes a plurality of metal layers, namely M1, M2 . . . Mtop, wherein the metal layer M1 is the metal layer immediately above the ILD 430, while metal layer Mtop is the top metal layer that is immediately under the overlying capacitors C (not shown in FIG. 17, please refer to FIG. 19), which are formed in subsequent operations. Throughout the description, the term "metal layer" refers to the collection of the metal lines in the same layer. The metal layers M1 through Mtop are formed in inter-metal dielectrics (IMDs) 445, which may be formed of oxides such as Un-doped Silicate Glass (USG), Fluorinated Silicate Glass (FSG), low-k dielectric materials, or the like. The low-k dielectric materials may have k values lower than 3.8, although the dielectric materials of IMDs 445 may also be close to 3.8. In some embodiments, the k values of the low-k dielectric materials are lower than about 3.0, and may be lower than about 2.5.

Figure 18:
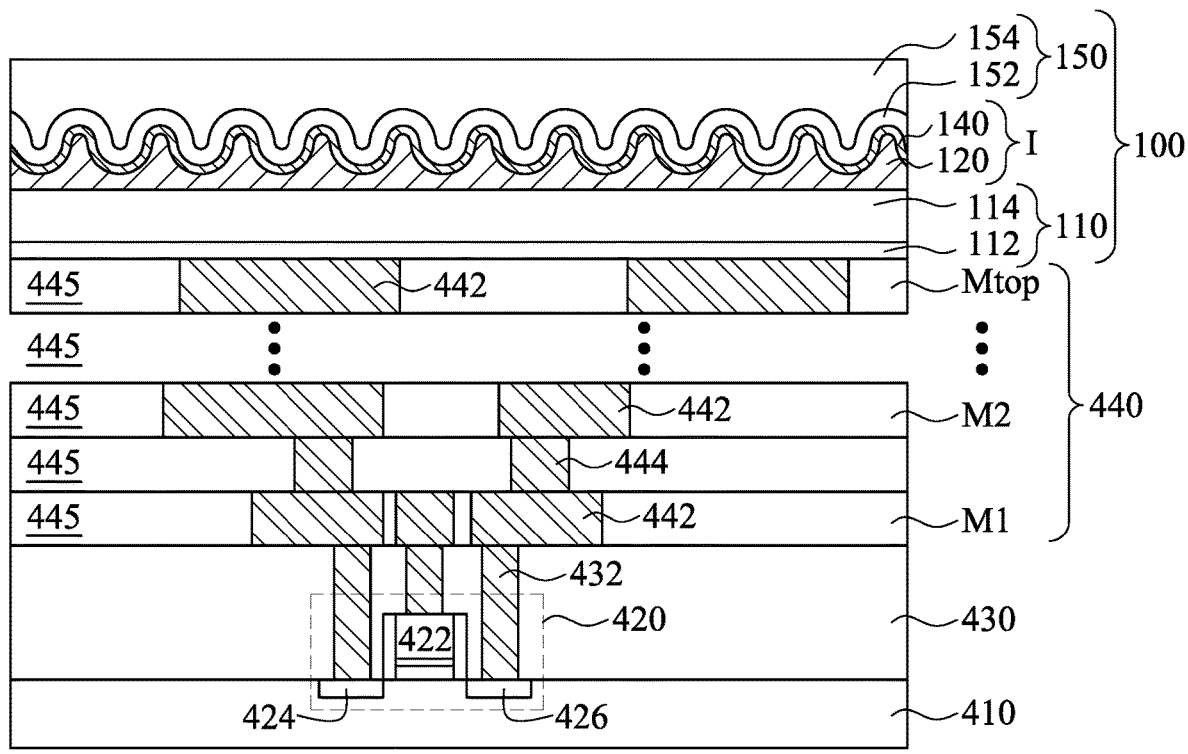

Reference is made to FIG. 18. Over the interconnection structure 440 is a capacitor layer 100 in accordance with some embodiments. Since the formation of the capacitor layer 100 is similar to that of the capacitor mentioned in FIGS. 1 to 12, and thus a description thereof is omitted.

Figure 19:
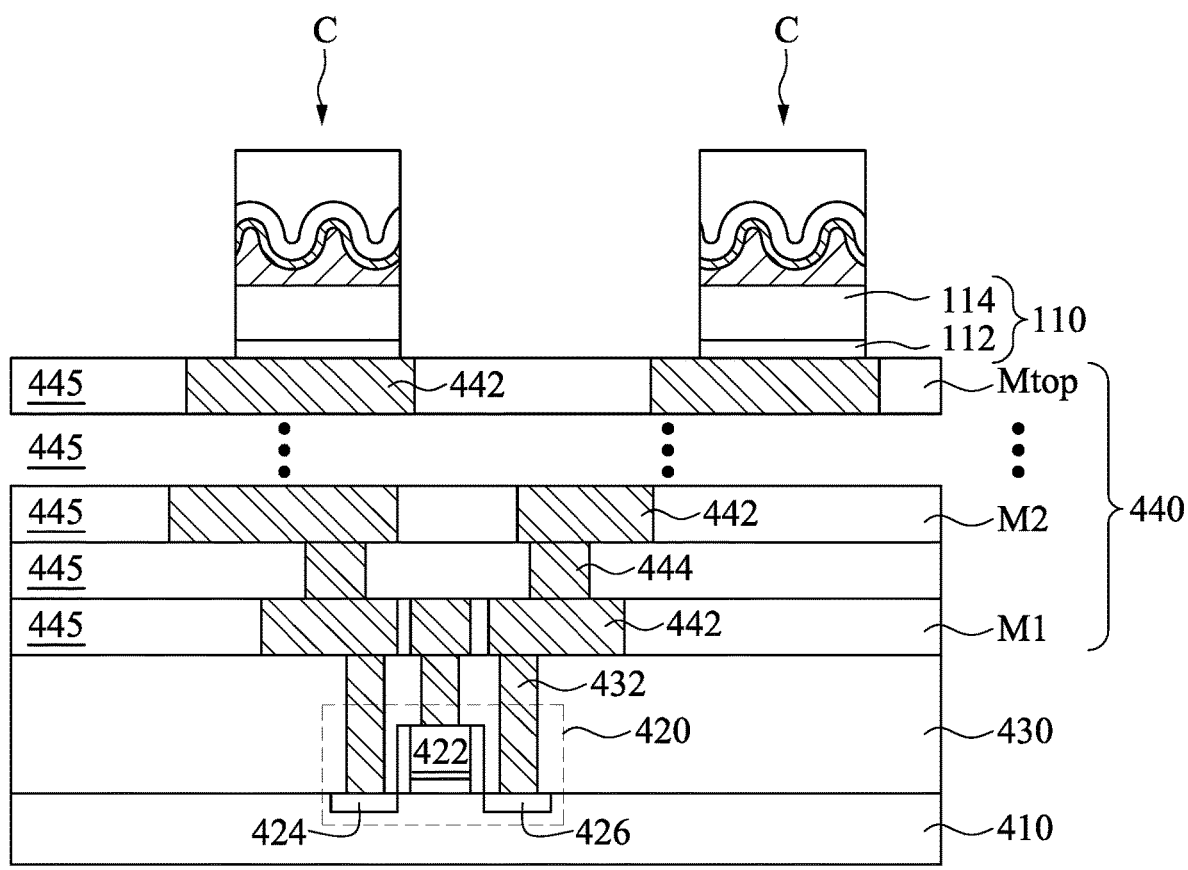

Reference is made to FIG. 19. The capacitor layer 100 of FIG. 18 is patterned to be at least one capacitor C. For example, in FIG. 19, two capacitors C are formed on the interconnection structure 440. The bottom electrodes 110 of the capacitors C are respectively in contact with the metal layer Mtop, such that the capacitors C are electrically connected to the interconnection structure 440. In some embodiments, the capacitor layer 100 may be patterned by using a lithoghaphy and then etching process. The etching process may be a dry etching process, a wet etching process, or combinations thereof.

Figure 20:
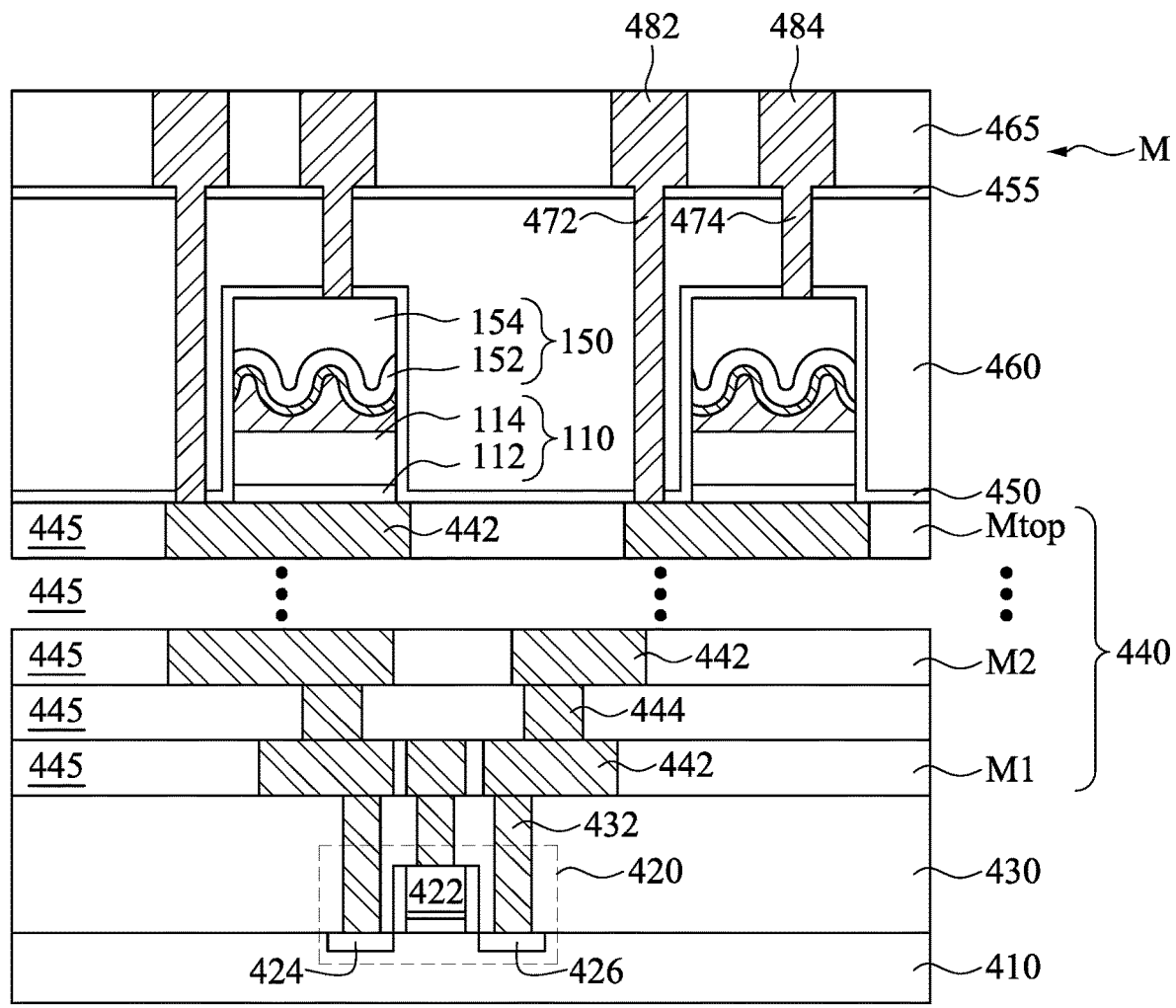

Reference is made to FIG. 20. An ESL 450, another ILD 460, and another interconnection layer M are formed over the capacitors C. The interconnection layer M includes metal lines 482 and 484, the contact plugs 472 and 474, ILD 465, and ESL 455. Since the details of the ESL 450, the ILD 460, and the interconnection layer M are similar to the ESL 330, the ILD 340, and the interconnection layer M of FIG. 16, a description thereof is omitted.

According to some embodiments, a semiconductor device includes a semiconductor substrate, a capacitor, and an interconnection layer. The capacitor is over the semiconductor substrate and includes a bottom electrode, a top electrode, and an insulator layer. The top electrode has a top surface and a bottom surface rougher than the top surface of the top electrode. The insulator layer is between the bottom electrode and the top electrode. The interconnection layer is over the semiconductor substrate and is electrically connected to the capacitor.

According to some embodiments, a semiconductor device includes a semiconductor substrate, a capacitor, and an interconnection layer. The capacitor is over the semiconductor substrate and includes a bottom electrode, a top electrode, and an insulator layer. The insulator layer is between the bottom electrode and the top electrode. The insulator layer has a top surface and a bottom surface flatter than the top surface. The interconnection layer is over the semiconductor substrate and electrically connected to the capacitor.

According to some embodiments, a method for manufacturing a semiconductor device includes forming a capacitor over a semiconductor substrate including forming a bottom electrode over the semiconductor substrate. An insulator layer is formed on the bottom electrode. A top surface of the insulator layer is rougher than a bottom surface of the insulator layer. A top electrode is formed on the insulator layer. An interconnection layer is formed over the semiconductor substrate and is electrically connected to the capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor substrate;
a capacitor over the semiconductor substrate, the capacitor comprising:
a bottom electrode;
a top electrode has a top surface and a bottom surface rougher than the top surface of the top electrode; and
an insulator layer between the bottom electrode and the top electrode, the insulator layer comprising:
a dielectric structure comprising Si—O—Si and in direct contact with the bottom electrode; and
a high-k dielectric layer between the dielectric structure and the top electrode, wherein an outer sidewall of the insulating layer and an outer sidewall of the bottom electrode are substantially coterminous, and a top surface of the high-k dielectric layer has a plurality of recessed portions; and
an interconnection layer over the semiconductor substrate and electrically connected to the capacitor.

2. The semiconductor device of claim 1, wherein the top electrode comprises a base and a plurality of bumps protruding from the base towards the insulator layer.

3. The semiconductor device of claim 2, wherein at least one of the plurality of bumps has a width in a range of about 0.05 nm to about 2 nm.

4. The semiconductor device of claim 1, wherein a top surface of the dielectric structure is rougher than a bottom surface of the dielectric structure.

5. The semiconductor device of claim 4, wherein the top surface of the dielectric structure has a plurality of recessed portions.

6. The semiconductor device of claim 4, wherein the high-k dielectric layer is conformally on the dielectric structure.

7. The semiconductor device of claim 6, wherein a dielectric constant of the high-k dielectric layer is higher than a dielectric constant of the dielectric structure.

8. The semiconductor device of claim 6, wherein the high-k dielectric layer is in contact with the dielectric structure and the top electrode.

9. The semiconductor device of claim 1, wherein the bottom surface of the top electrode is rougher than a top surface of the bottom electrode.

10. A semiconductor device comprising:
a semiconductor substrate;
a capacitor over the semiconductor substrate, the capacitor comprising:
a bottom electrode;
a top electrode; and
an insulator layer between the bottom electrode and the top electrode, wherein the insulator layer has a top surface and a bottom surface flatter than the top surface, comprising:
a dielectric structure comprising Si—O—Si and in direct contact with the bottom electrode and having a first outer sidewall and a second outer sidewall opposite to the first outer sidewall, wherein the dielectric structure further has a substantially flat bottom surface extending from the first outer sidewall to the second outer sidewall of the dielectric structure; and
a high-k dielectric layer over the dielectric structure and spaced apart from the bottom electrode; and
an interconnection layer over the semiconductor substrate and electrically connected to the capacitor.

11. The semiconductor device of claim 10, wherein the top surface of the insulator layer has a plurality of recessed portions.

12. The semiconductor device of claim 11, wherein each of the recessed portions has a width in a range of about 0.05 nm to about 2 nm.

13. The semiconductor device of claim 10, wherein the top surface of the insulator layer is rougher than a bottom surface of the bottom electrode.

14. The semiconductor device of claim 10, wherein the top surface of the insulator layer is rougher than a top surface of the top electrode.

15. A semiconductor device comprising:
a capacitor comprising:
a bottom electrode;
a top electrode; and
an insulating layer between the bottom electrode and the top electrode, wherein the insulating layer comprises:
a dielectric structure comprising Si—O—Si and including:
a top surface including a plurality of bumps protruding toward the top electrode; and
a base portion connecting the bumps; and
a high-k dielectric layer between the dielectric structure and the top electrode, wherein the high-k dielectric layer comprises $HfO_2$, $HfSiO_x$, $HfZrO_x$, $HfAlO_x$, $HfLaO_x$, $HfTiO_x$, $HfTaO_x$, $HfTiTaO_x$, $LaO_3$, $ZrO_2$, $Al_2O_3$, $Ta_2O_5$, $TiO_2$, or combinations thereof;
an etch stop layer covering and in contact with the bottom electrode and the insulating layer; and
an interconnection layer electrically connected to the capacitor.

16. The semiconductor device of claim 2, wherein the top electrode comprises a plurality of bumps protruding toward the dielectric structure.

17. The semiconductor device of claim 2, wherein the high-k dielectric layer is conformal to a top surface of the dielectric structure.

18. The semiconductor device of claim 2, wherein the high-k dielectric layer is conformal to a bottom surface of the top electrode.

19. The semiconductor device of claim 2, wherein the dielectric structure is an oxide layer.

20. The semiconductor device of claim 1, wherein the dielectric structure comprises Si.

* * * * *